(12) United States Patent
Lin et al.

(10) Patent No.: US 9,865,584 B1
(45) Date of Patent: Jan. 9, 2018

(54) CONTACT ARRAY OPTIMIZATION FOR ESD DEVICES

(71) Applicant: Texas Instruments Incorporated, Dallas, TX (US)

(72) Inventors: He Lin, Frisco, TX (US); Kun Chen, Sichuan (CN); Chao Wu, Sichuan (CN); Dening Wang, McKinney, TX (US); Lily Springer, Dallas, TX (US); Andy Strachan, Santa Clara, CA (US); Gang Xue, San Jose, CA (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

(21) Appl. No.: 15/344,087

(22) Filed: Nov. 4, 2016

Related U.S. Application Data

(63) Continuation of application No. PCT/CN2016/087951, filed on Jun. 30, 2016.

(51) Int. Cl.
*H01L 27/02* (2006.01)
*H01L 27/08* (2006.01)
*H01L 29/866* (2006.01)
*H01L 29/06* (2006.01)

(52) U.S. Cl.
CPC ...... *H01L 27/0248* (2013.01); *H01L 27/0814* (2013.01); *H01L 29/0649* (2013.01); *H01L 29/0692* (2013.01); *H01L 29/866* (2013.01)

(58) Field of Classification Search
CPC ............ H01L 27/0248; H01L 27/0814; H01L 29/0692; H01L 29/0649; H01L 29/866
USPC .......................................................... 257/546
See application file for complete search history.

(56) References Cited

U.S. PATENT DOCUMENTS

| | | | | |
|---|---|---|---|---|
| 6,157,065 | A * | 12/2000 | Huang | H01L 23/60 257/173 |
| 6,888,710 | B2 * | 5/2005 | Mallikarjunaswamy | H01L 27/0259 257/E29.197 |
| 7,091,556 | B2 * | 8/2006 | Edwards | H01L 27/088 257/336 |
| 7,786,507 | B2 | 8/2010 | Denison et al. | |
| 8,563,426 | B2 * | 10/2013 | Chumakov | H01L 21/76804 438/638 |

\* cited by examiner

*Primary Examiner* — Vu A Vu
(74) *Attorney, Agent, or Firm* — Tuenlap D. Chan; Charles A. Brill; Frank D. Cimino

(57) ABSTRACT

A contact array optimization scheme for ESD devices. In one embodiment, contact apertures patterned through a pre-metal dielectric layer over active areas may be selectively modified in size, shape, placement and the like, to increase ESD protection performance, e.g., such as maximizing the transient current density, etc., in a standard ESD rating test.

20 Claims, 9 Drawing Sheets

CONTACT ARRAY OPTIMIZATION FOR ESD DEVICES

PRIORITY AND CROSS-REFERENCE TO RELATED APPLICATION(S)

This is a continuation of copending International Application No. PCT/CN2016/087951, with an international filing date of Jun. 30, 2016, entitled "CONTACT ARRAY OPTIMIZATION FOR ESD DEVICES," in the name(s) of: He Lin, Kun Chen, Chao Wu, Dening Wang, Lily Springer, Andy Strachan, and Gang Xue, which designated the United States and is hereby fully incorporated herein by reference for all purposes.

FIELD OF THE DISCLOSURE

This disclosure relates generally to the field of semiconductor devices and the methods of fabrication thereof, and more particularly, without limitation, to contact array optimization in electrostatic discharge (ESD) protection circuits.

BACKGROUND

Without limitation, the following is provided in the context of fabricating ESD protection circuits. Electrostatic discharge (ESD) is a continuing problem in the design, manufacture, and utilization of semiconductor devices. For example, a major source of ESD exposure to integrated circuits (ICs) and other electronic devices is from the human body (as described by the "Human Body Model" or HBM, for example). In this situation, a packaged IC acquires a charge when it is held by a human who is electrostatically charged (e.g., from walking across carpeting). A charge of about 0.6 µC can be induced on a body capacitance of 150 pF, for example, leading to electrostatic potentials of 4 kV or greater and discharging peak currents of several amperes to the IC for about 100 ns, for example. A second source of ESD is from metallic objects (e.g., as described by the "Machine model" or MM), which is characterized by a greater capacitance, lower internal resistance and transients that have significantly higher rise times and current levels than the HBM ESD source. A third source is described by the "charged device model" (CMD), in which the IC itself becomes charged and discharges to ground in rise times less than 500 ps in the opposite direction than the HBM and MM ESD sources. Furthermore, different types of electrical overstresses during circuit operation are defined in standards dedicated to specific applications like set-top boxes, automotive systems, mobile and handheld devices, laptops and desktops, etc.

During ESD events, current is typically discharged between one or more pins or pads exposed to the outside of an IC chip. Such ESD current flows from the pad to ground through vulnerable circuitry in the IC, which may not be designed to carry such currents. Many ESD protection techniques have been employed to reduce or mitigate the adverse effects of ESD events in IC devices. Typically, conventional ESD protection schemes for ICs employ peripheral circuits to carry the ESD currents from the pin or pad of the device to ground by providing a low impedance path thereto. In this way, the ESD currents flow through the protection circuitry, rather than through the more susceptible circuits in the chip.

As the advances in the design of ICs continue to take place, including ever-shrinking line geometries, improvements in ESD protection techniques and circuits are also being continually sought.

SUMMARY

The following presents a simplified summary in order to provide a basic understanding of one or more aspects of the invention. This summary is not an extensive overview of the invention, and is neither intended to identify key or critical elements of the invention, nor to delineate the scope thereof. Rather, the primary purpose of the summary is to present some concepts of the invention in a simplified form as a prelude to a more detailed description that is presented later.

In one aspect, an embodiment of a semiconductor fabrication method operative in an ESD device process flow is disclosed. The claimed embodiment comprises, inter alia, forming an active area as part of an ESD protection circuit in a semiconductor substrate according to a select process technology and forming a dielectric layer over the active area. A contact array layer mask having features corresponding to a plurality of contact apertures may be provided, wherein the features are modified in a select manner. The dielectric layer is then patterned to define, form or otherwise create, using the contact array layer mask, a plurality of contact apertures in at least a portion overlapping the active area. In an embodiment, the contact apertures each have a size and/or a shape based on an ESD protection parameter (e.g. electrical parameters relating to transient current density, etc.). A suitable metallic composition is deposited and processed to fill the plurality of contact apertures so as to provide an electrical conductive path between the active area and a metal layer deposited over the dielectric layer.

In another aspect, an embodiment of an integrated circuit or device is disclosed. The claimed embodiment comprises, inter alia, an active area formed as part of an ESD protection circuit in a semiconductor substrate according to a select process technology and a dielectric layer formed over the active area. A metal layer is disposed on the dielectric layer. A contact structure is formed between the active area and the metal layer, the contact structure having contact apertures patterned through the dielectric layer and filled with a metallic composition to provide an electrical conductive path between the active area and the metal layer, the contact apertures each having a size based on an ESD protection parameter of the ESD protection circuit. In one implementation, the contact apertures may be optimized in at least one of selectively (re)sizing, (re)shaping and layout, etc. to provide increased ESD protection performance relating to at least one of a dynamic current flow, e.g., including transient current density parameters, etc.

BRIEF DESCRIPTION OF THE DRAWINGS

Embodiments of the present disclosure are illustrated by way of example, and not by way of limitation, in the Figures of the accompanying drawings in which like references indicate similar elements. It should be noted that different references to "an" or "one" embodiment in this disclosure are not necessarily to the same embodiment, and such references may mean at least one. Further, when a particular feature, structure, or characteristic is described in connection with an embodiment, it is submitted that it is within the knowledge of one skilled in the art to effect such feature, structure, or characteristic in connection with other embodiments whether or not explicitly described.

The accompanying drawings are incorporated into and form a part of the specification to illustrate one or more exemplary embodiments of the present disclosure. Various advantages and features of the disclosure will be understood from the following Detailed Description taken in connection with the appended claims and with reference to the attached drawing Figures in which:

FIGS. 4A-2 to 4H depict example embodiments of an optimized contact aperture design of the present invention for improving ESD protection performance.

DETAILED DESCRIPTION OF THE DRAWINGS

Figure 1A:
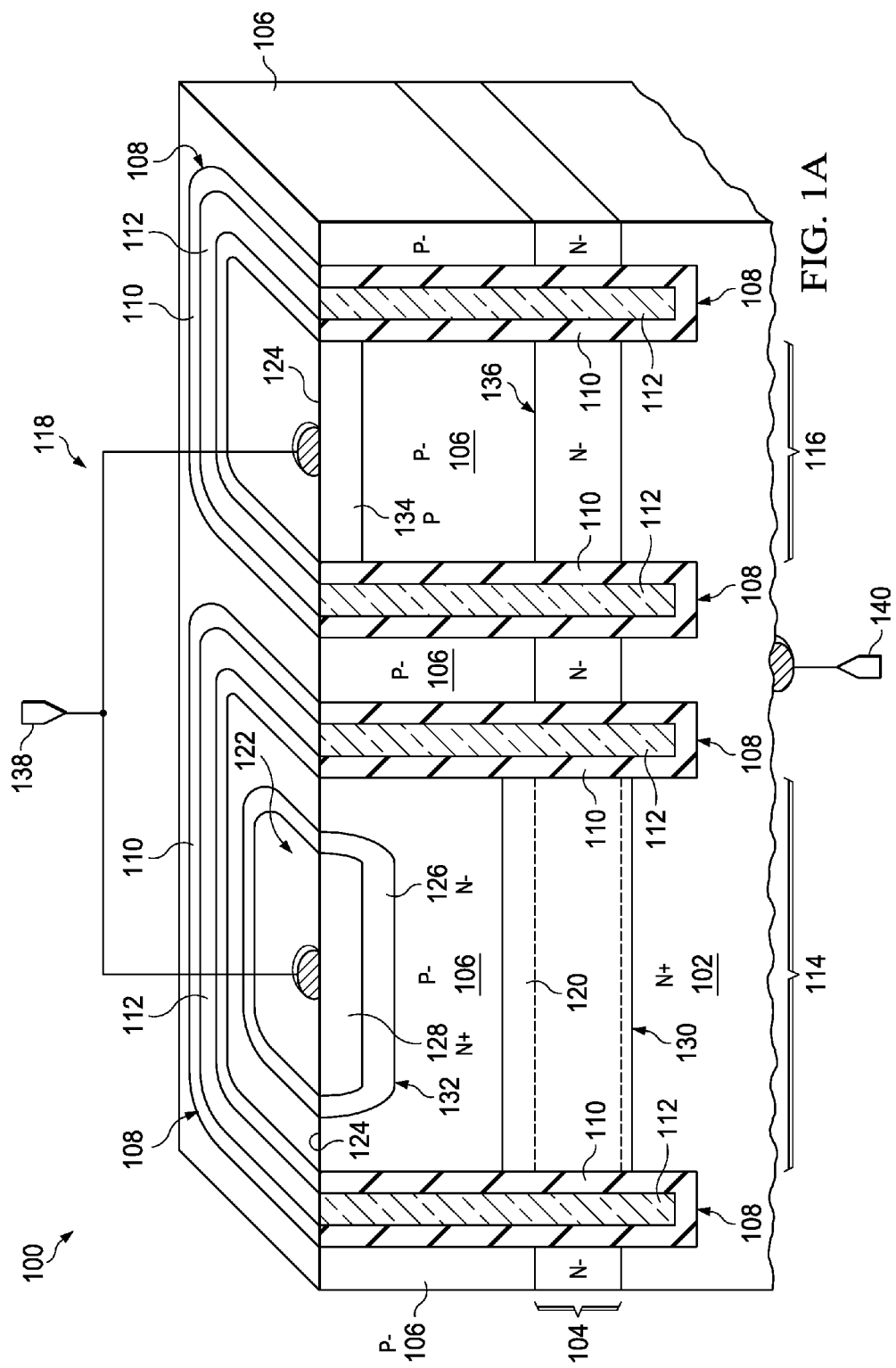
FIG. 1A is a 3-dimensional cross-sectional view of an example integrated circuit, semiconductor device or portion thereof having an ESD protection circuit wherein one or more embodiments of the present invention may be practiced.

The present invention is described with reference to the attached Figures wherein like reference numerals are generally utilized to refer to like elements throughout. The Figures are not drawn to scale and they are provided merely to illustrate the invention. Several aspects of the invention are described below with reference to example applications for illustration. It should be understood that numerous specific details, relationships, and methods are set forth to provide an understanding of the invention. One skilled in the relevant art, however, will readily recognize that the invention can be practiced without one or more of the specific details or with other methods. In other instances, well-known structures or operations are not shown in detail to avoid obscuring the invention. The present invention is not limited by the illustrated ordering of acts or events, as some acts may occur in different orders and/or concurrently with other acts or events. Furthermore, not all illustrated acts or events are required to implement a methodology in accordance with the present invention.

In the following description, reference may be made to the accompanying drawings wherein certain directional terminology, such as, e.g., "upper", "lower", "top", "bottom", "left-hand", "right-hand", "front side", "backside", "vertical", "horizontal", etc., may be used with reference to the orientation of the Figures or illustrative elements thereof being described. Since components of embodiments can be positioned in a number of different orientations, the directional terminology is used for purposes of illustration and is in no way limiting. Likewise, references to features referred to as "first", "second", etc., are not indicative of any specific order, importance, and the like, and such references may be interchanged mutatis mutandis, depending on the context, implementation, etc. It is understood that further embodiments may be utilized and structural or logical changes may be made without departing from the scope of the present invention. The features of the various exemplary embodiments described herein may be combined with each other unless specifically noted otherwise.

As employed in this specification, the terms "coupled", "electrically coupled", "connected" or "electrically connected" are not meant to mean that elements must be directly coupled or connected together. Intervening elements may be provided between the "coupled", "electrically coupled", "connected" or "electrically connected" elements.

Example semiconductor devices described below may include or formed of a semiconductor material like Si, SiC, SiGe, GaAs or an organic semiconductor material. The semiconductor material may be embodied as a semiconductor wafer or a semiconductor chip containing any type of ICs, for example including but not limited to, ESD protection circuits. The semiconductor chip may further include inorganic and/or organic materials that are not semiconductors, for example, insulators such as dielectric layers, plastics or metals, etc.

Referring now to the drawings and more particularly to FIG. 1A, shown therein is a 3-dimensional view illustrating a cross-sectional representation of an example semiconductor device or portion thereof 100 having an ESD protection circuit 118 wherein one or more embodiments of the present invention involving a contact array optimization scheme may be practiced. In one implementation, ESD protection circuit 118 may be formed as a bidirectional diode including an LR-LC diode (e.g., back-to-back connected Zener diodes) that may be fabricated using a class of process technologies specified and/or standardized for manufacture of various types of transient voltage suppressor (TVS) devices. As one skilled in the art will recognize, such process technologies may comprise a particular sequence of process steps depending on the foundry and specific fabrication process, which may be grouped as a series of front end-of-line (FEOL) steps followed by a group of back end-of-line (BEOL) steps. The semiconductor device 100 may include an n-type substrate 102 having, e.g., an average dopant density greater than $1 \times 10^{18}$ cm$^{-3}$. The substrate 102 may be, for example, part of a bulk silicon wafer. The semiconductor device 100 includes a lightly-doped n-type layer 104 of silicon-based semiconductor material, for example phosphorus-doped crystalline silicon, disposed on the substrate 102. The n-type layer 104 may have a thickness of about 1 micron to 5 microns, and may have an average dopant density that is less than $1 \times 10^{16}$ cm$^{-3}$. The n-type layer 104 may be an epitaxial layer formed on the substrate 102. The semiconductor device 100 also includes a lightly-doped p-type layer 106 of silicon-based semiconductor material, for example, boron-doped crystalline silicon, disposed on the n-type layer 104. The p-type layer 106 may be of 3 microns to 8 microns thick, and may have an average dopant density less than $1 \times 10^{15}$ cm$^{-3}$. The p-type layer 106 may be an epitaxial layer formed on the n-type layer 104.

One or more isolation structures 108 laterally isolate an area for an LR-LC diode 114 and laterally isolate an area for a parallel diode 116 formed as part of the semiconductor device 100. The isolation structures 108 may be deep trench isolation structures 108 with dielectric liners 110 and field plates 112 of polycrystalline silicon, referred to as polysilicon, on the dielectric liners 110, as depicted in FIG. 1A. Other physical forms for the isolation structures 108 are within the scope of the instant example. It should be appreciated that the LR-LC diode 114 and the parallel diode 116 are formed as components of the bidirectional diode 118.

A p-type buried layer 120 is disposed in the LR-LC diode 114, extending from the p-type layer 106 through the n-type layer 104 to the substrate 102. The n-type layer 104 is depicted in FIG. 1A with dashed lines in the p-type buried layer 120. The p-type buried layer 120 has a peak dopant density greater than $1\times10^{17}$ cm$^{-3}$. The p-type buried layer 120 may extend laterally across the LR-LC diode 114 as depicted in FIG. 1A. An n-type region 122 is disposed in the LR-LC diode 114, in the p-type layer 106. The n-type region 122 may be an n-type well 122 extending to a top surface 124 of the p-type layer 106. The n-type region 122 may include a lighter-doped outer portion 126 at least around 100 nanometers thick contacting the p-type layer 106 and a heavier-doped inner portion 128 surrounded by the lighter-doped outer portion 126. The lighter-doped outer portion 126 may have an average dopant density of $1\times10^{16}$ cm$^{-3}$ to $1\times10^{17}$ cm$^{-3}$, by way of example. The heavier-doped inner portion 128 may have an average dopant density of, for example, $1\times10^{17}$ cm$^{-3}$ to $3\times10^{19}$ cm$^{-3}$.

A first pn junction 130 of the LR-LC diode 114 is formed at a boundary between the p-type buried layer 120 and the n-type substrate 102. A second pn junction 132 is likewise formed at a boundary between the p-type layer 106 and the n-type region 122. The first pn junction 130 and the second pn junction 132 are in a back-to-back series connection. A p-type region 134, for example a p-type well 134, is disposed in the p-type layer 106 in the parallel diode 116, extending to the top surface 124 of the p-type layer 106. In an example embodiment, there may be at least a micron of vertical separation between the p-type region 134 and the n-type layer 104. The p-type region 134 may extend across the parallel diode 116 as depicted in FIG. 1A, or may be recessed from the isolation structures 108. The p-type region 134 has an average dopant density of at least $1\times10^{17}$ cm$^{-3}$ and may provide a desired low resistance contact to the parallel diode 116. A third pn junction 136 of the parallel diode 116 is formed at a boundary of the n-type layer 104 and the p-type layer 106. The p-type buried layer 120 in the LR-LC diode 114 does not extend into the parallel diode 116. A first terminal 138 of the bidirectional diode 118 may be electrically connected to the n-type region 122 of the LR-LC diode 114 and to the p-type region 134 of the parallel diode 116 by way of appropriate contact structures and metallization as will be set forth in additional detail below. In similar fashion, a second terminal 140 may be electrically connected to the substrate 102, possibly comprising yet another suitable contact structure. During operation of the bidirectional diode 118, a voltage excursion which is positive on the first terminal 138 relative to the second terminal 140 forward biases the parallel diode 116 and is thus shunted through the parallel diode 116. A voltage excursion which is negative on the first terminal 138 relative to the second terminal 140 forward biases the second pn junction 132 and causes breakdown in the first pn junction 130 in the LR-LC diode 114 and is thus shunted through the LR-LC diode 114.

Figure 1B:
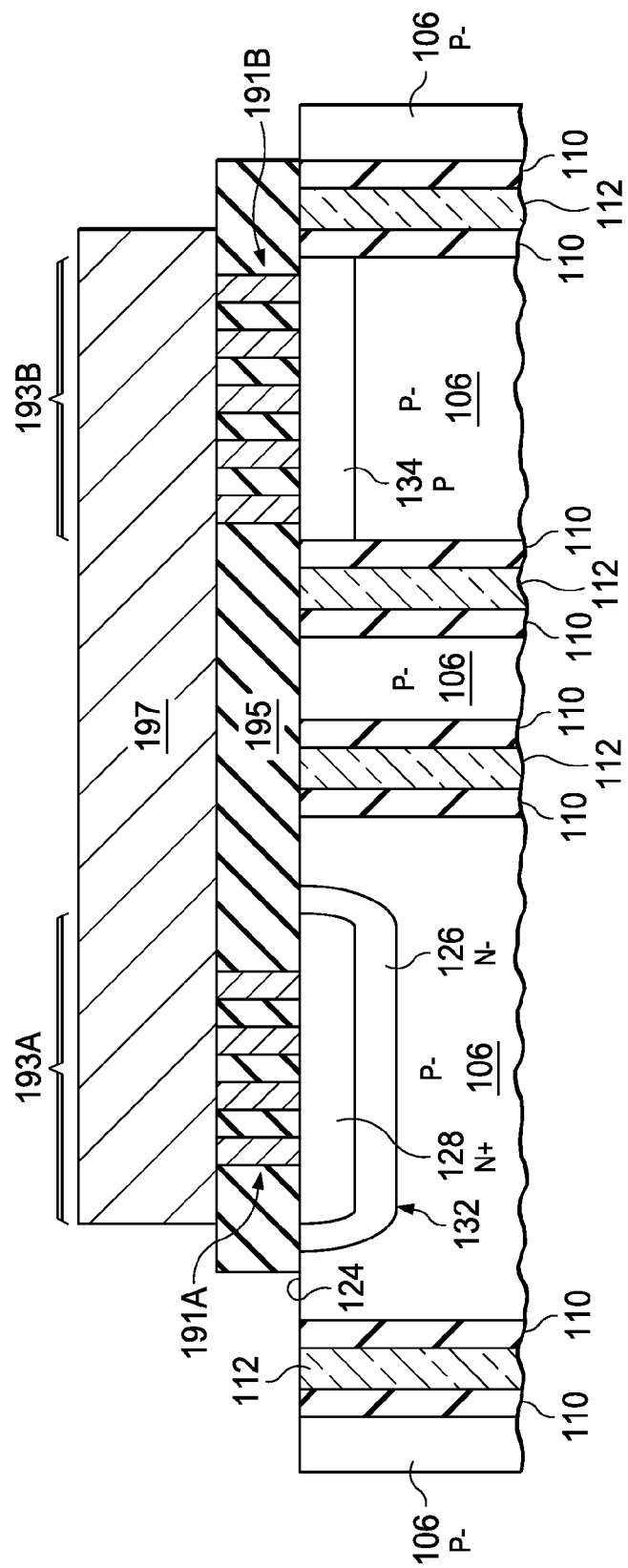
FIG. 1B is a cross-sectional view of a portion of the integrated circuit of FIG. 1A illustrating back end-of-line (BEOL) process steps in an example flow according to a select process or fabrication technology wherein an optimized contact array design may be provided according to an embodiment of the present invention.

FIG. 1B is a cross-sectional view of a portion of the semiconductor device or integrated circuit 100 of FIG. 1A showing additional details with respect to a plurality of back end-of-line (BEOL) process steps in an example flow according to a select process or fabrication technology wherein an optimized contact array design may be provided according to an embodiment of the present invention. As noted above, active areas comprising n-type and p-type wells 126/128 and 134, respectively, may be formed according to a front end-of-line process flow (FEOL) in the manufacture of a TVS semiconductor device 100. In general, a BEOL process flow may involve providing a dielectric layer (e.g., a pre-metal dielectric or PMD layer) to electrically isolate active areas, which may be processed thereafter to a desired thickness using known technologies such as a chemical-mechanical polish (CMP) process. Where electrical connectivity between an active area and a metal layer is required, a contact layer mask having features that comply with specific design rules may be used for creating a plurality of holes or apertures through the dielectric layer overlying the active area, which may be filled or plugged with appropriate metals or metallic compositions. Thereafter, a metallization layer may be formed using technologies such as, e.g., physical/chemical vapor deposition (P/CVD). Some BEOL process flows may involve more than one metal layer, each being separated from its adjacent metal layer by suitable insulation (e.g., inter-metal dielectric layers), that may be interconnected through via structures. A final passivation layer or protective overcoat (PO) of appropriate thickness may be formed over the integrated circuit to provide protection from external ambient conditions.

As illustrated in the example cross-sectional view of FIG. 1B, a dielectric layer of 195 of about several thousand Angstroms (Å) thick may be formed over the n-well and p-well areas 128, 134 using known technologies. For example, the dielectric layer 195 may comprise a film of about 5,000 to 25,000 Angstroms in thickness that includes one or more layers of a composition selected from silicon nitride, oxynitride, silicon oxide, etc. Reference numeral 191A refers to a contact array structure having a plurality of contact holes (or, more generally, apertures) patterned in a portion of the dielectric layer 195 and plugged with a suitable metal, disposed between the n-well area 128 and an overlapping portion 193A of a metal layer 197. Likewise, reference numeral 191B refers to another contact array structure having another plurality of plugged contact holes formed between the p-well area 134 and another overlapping portion 193B of the metal layer 197. According to an example process flow, the metallic composition filling the pluralities of contact apertures formed in the dielectric layer 195 may comprise tungsten (W) and tungsten-based compositions, although it should be understood that other metals, metallic compounds and compositions may also be used within the scope of the present invention. Metal layer 197, which may be of a suitable thickness, e.g., about 1.5 to 5 microns, may be formed using metals such as aluminum, copper, etc., in an example implementation.

As one skilled in the art will recognize, contact array apertures for the contact structures 191A, 191B may be formed in the dielectric layer 195 by employing standard photolithography processes such as photoresist, patterning, etching and photoresist removal, etc., wherein a contact layer mask having an appropriate layout of features corresponding to the array apertures is used, that may be specified for and/or in a particular process flow in terms of their size, shape, placement, and the like. Further, the physical layout of the semiconductor device being fabricated and associated particular process flow may also be specified by a series of recommended layout parameters, including, e.g., design rules, critical dimensions or CDs, etc. in order to ensure that a satisfactory yield of functional semiconductor dies may be obtained.

As such, design rules, which are often specific to a particular semiconductor manufacturing process, may be employed in the design of a semiconductor device to verify the correctness of a mask set for a particular process flow. Typically, a design rule set specifies certain geometric and connectivity restrictions to ensure sufficient margins to account for variability in semiconductor manufacturing processes, so as to ensure that most of the parts work correctly. Some of the most basic design rules may comprise line width rules (specifying the minimum width of any shape in the design), spacing rules (specifying the minimum distance between two adjacent objects), minimum area rules (specifying the minimum area of an object), etc., that relate to a single layer, e.g., including a contact array layer, of a process flow. To verify the integrity of a mask set, design rule checking (DRC) may be employed based on the layout files that are often provided in formats such as GDS, OASIS, and the like.

Figure 2:
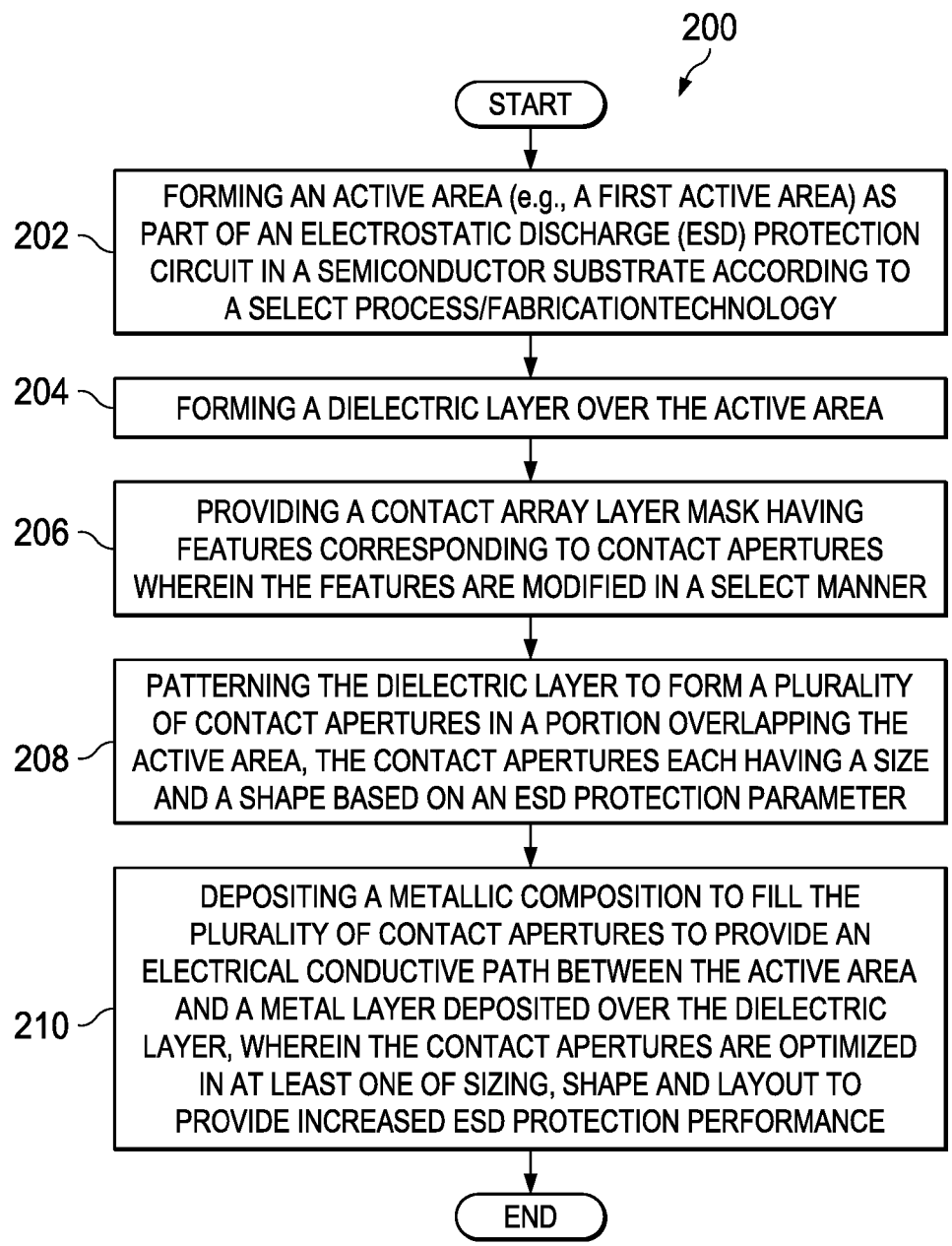
FIG. 2 is a flowchart of an example process according to an embodiment of the present invention.

The inventors of the present invention have discovered that the contact apertures of a contact array layer of a TVS device such as the semiconductor device 100 described above may be advantageously optimized in terms of sizing, shape, and layout, etc., in order to enhance the device's ESD performance as tested under applicable standardized ESD testing conditions, e.g., the International Electrotechnical Commission's IEC 61000-4-2 standard for ESD ratings, while still satisfying the design rules associated with the particular process technology used in its fabrication. Referring now to FIG. 2, depicted therein is a flowchart of an example optimization method 200 for fabricating an IC semiconductor device according to an embodiment of the present invention. At block 202, an active area (e.g., a first active area) may be formed as part of an ESD protection circuit in a semiconductor substrate according to a select process technology. As noted previously, such active areas may comprise, e.g., n-well areas, p-well areas, etc. of a bidirectional diode structure. At block 204, a dielectric layer may be formed over the active area. At block 206, a contact array layer mask having features corresponding to contact apertures may be provided, wherein the features are modified in a select manner as will be set forth in detail below. Thereafter, the dielectric layer may be patterned using the contact array layer mask with modified features (e.g., shapes of geometric objects, placement, etc.) to define, form otherwise a plurality of contact apertures in a portion overlapping the active area. Preferably, the contact apertures each have a shape and/or a size based on an ESD protection parameter (e.g., (e.g. electrical parameters relating to transient current density, etc.), as set forth in block 208. A suitable metallic composition is deposited to fill the plurality of contact apertures to provide an electrical conductive path between the active area and a metal layer deposited over the dielectric layer. In an example implementation, therefore, the contact apertures may be optimized in at least one of sizing, shape and layout to provide increased ESD protection performance, e.g., such as maximizing the transient current density, etc., in a standard ESD rating test as set forth in block 210.

Various example embodiments of a modified contact array design that may be used in the foregoing methodology will now be set forth in additional detail below by taking reference to the remaining drawing figures of the present patent application.

Figure 3:
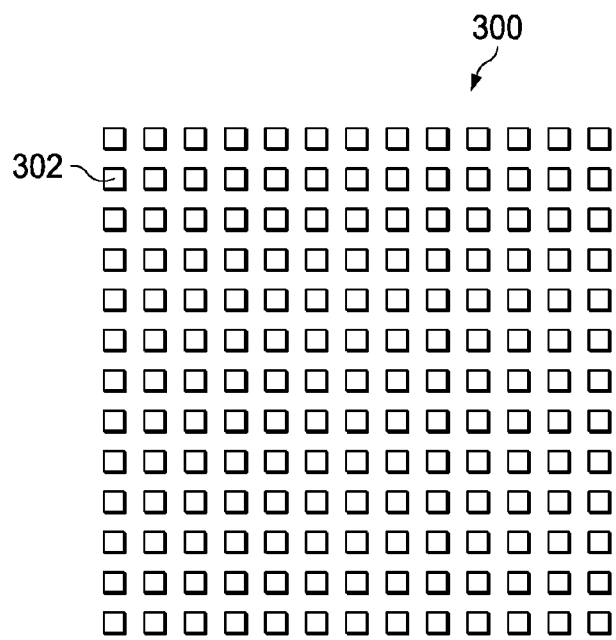
FIG. 3 depicts a conventional contact aperture array according to a select process technology.
Figures 1, 4A:
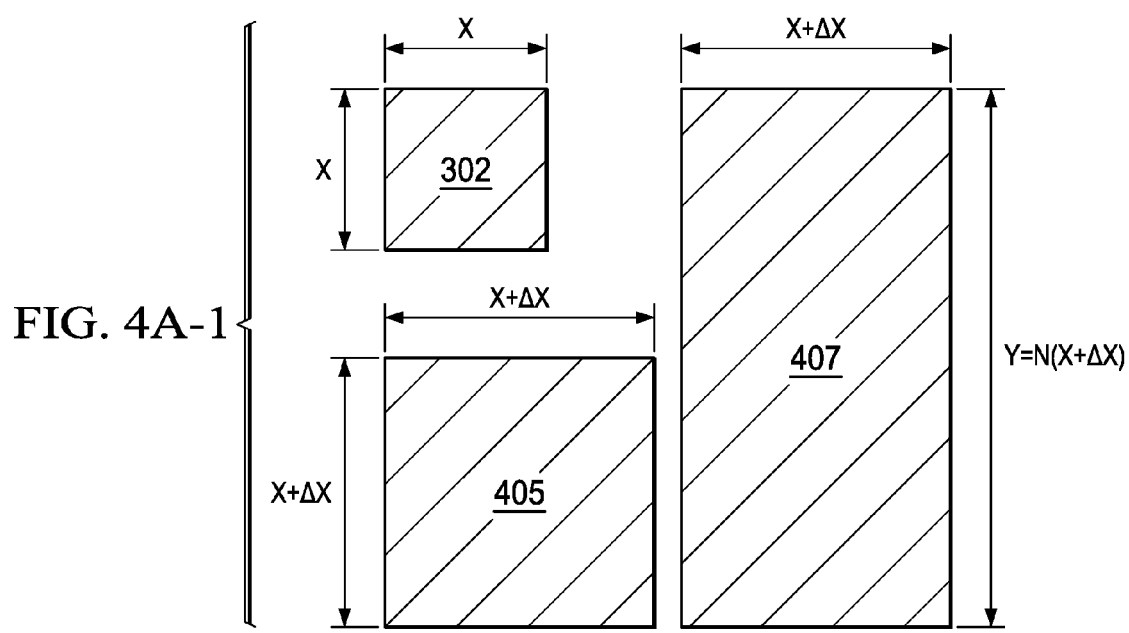
FIG. 4A-1 depicts example design schemes that may be used for an individual contact aperture in accordance with the teachings of the present invention.
Figures 2, 4A:
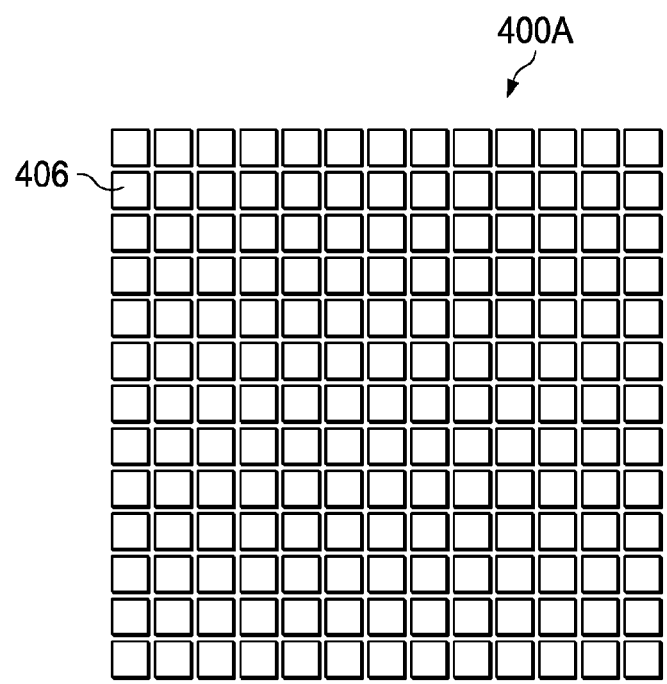

FIG. 3 is a conventional contact aperture array 300 according to a select process technology that illustrates a plurality of features 302 having a square shape that are arranged in a row- and column-aligned array. In a typical implementation, the size of a contact aperture may be 0.43 µm by 0.43 µm, as illustrated in FIG. 4A-1. One skilled in the art will recognize that these feature sizes may refer to the drawn sizes in the layout file associated with the contact array mask rather than the actual printed features in the semiconductor material (which may be of different size and/or shape due to photolithographic effects including proximity effects and the like). FIG. 4A-1 also depicts two example design schemes that may be used for an individual contact aperture in accordance with an embodiment of the present invention. In one variation, the shape of an individual contact aperture may still be a square but may have an enlarged size, as shown in modified contact aperture 405. Both X- and Y-direction dimensions of the aperture may be enlarged by a select amount (e.g., $\Delta X$, $\Delta Y$, or both), wherein the X- and Y-directions may be taken in respect of a particular reference axis provided for the mask, e.g., in reference to a wafer flat, etc. In one example implementation, a modified contact aperture 405 may have a size of about 0.62 µm by 0.62 µm. In another variation, an individual contact aperture may be enlarged in one direction but not in the other as compared to the conventional size specified in a select process technology. In anther variation, both X- and Y-direction dimensions may be enlarged but with different amounts, thereby resulting in a rectangular geometry, e.g., as shown in modified contact aperture 407 wherein the X-direction size is increased to $(X+\Delta X)$ µm whereas the Y-direction size is increased to a multiple of the size in X-direction, i.e., $N(X+\Delta X)$ µm. A skilled artisan will clearly recognize that a number of further variations and modifications may be provided for an individual contact aperture within the scope of the teachings set forth herein, e.g., different geometric shapes, dimensions, switching the orientation of X and Y coordinates, etc.

In a still further variation, only a subset rather than all apertures of a contact aperture array may be selectively modified. For instance, where the contact apertures are arranged in an N×N or N×M array, only a select number of rows and/or a select number of columns of apertures may be modified, e.g., having enlarged shapes. Preferably, such selective size enlargement may be implemented only for the apertures disposed along one or more peripheral edges of the array, thereby leaving the apertures of an interior region of the array as unmodified. In a still further variation, the layout of a contact aperture array may be modified such that a select number of apertures from a corner or vertex of the array (or a polygonal arrangement), may be removed altogether, i.e., devoid of any contact apertures, thereby resulting in a modified layout arrangement for a contact structure. For example, in a square array of contact apertures, each of the four corners may be devoid of contact apertures (either in same number or otherwise) such that a substantially octagonal arrangement (or some other polygonal arrangement) may be obtained for an example contact structure.

Figure 4B:
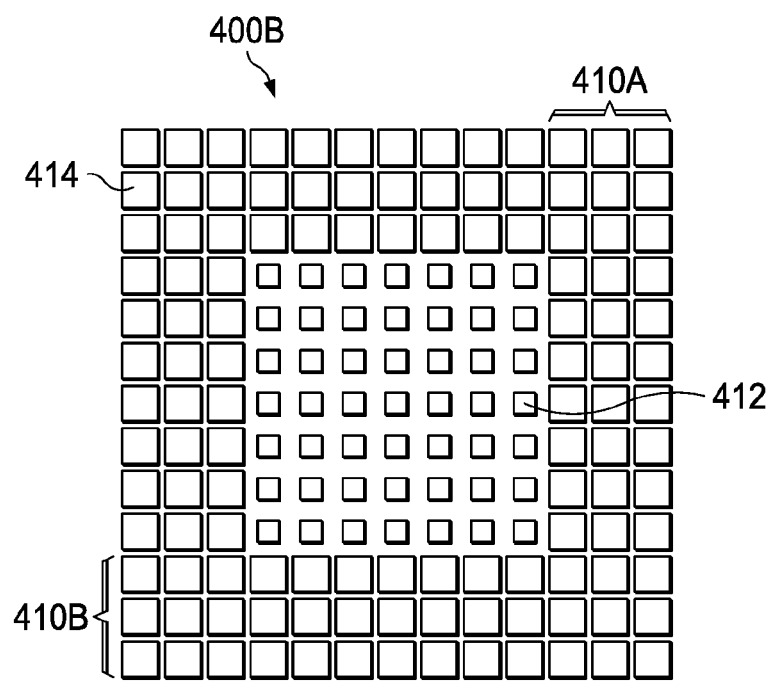
Figure 4C:
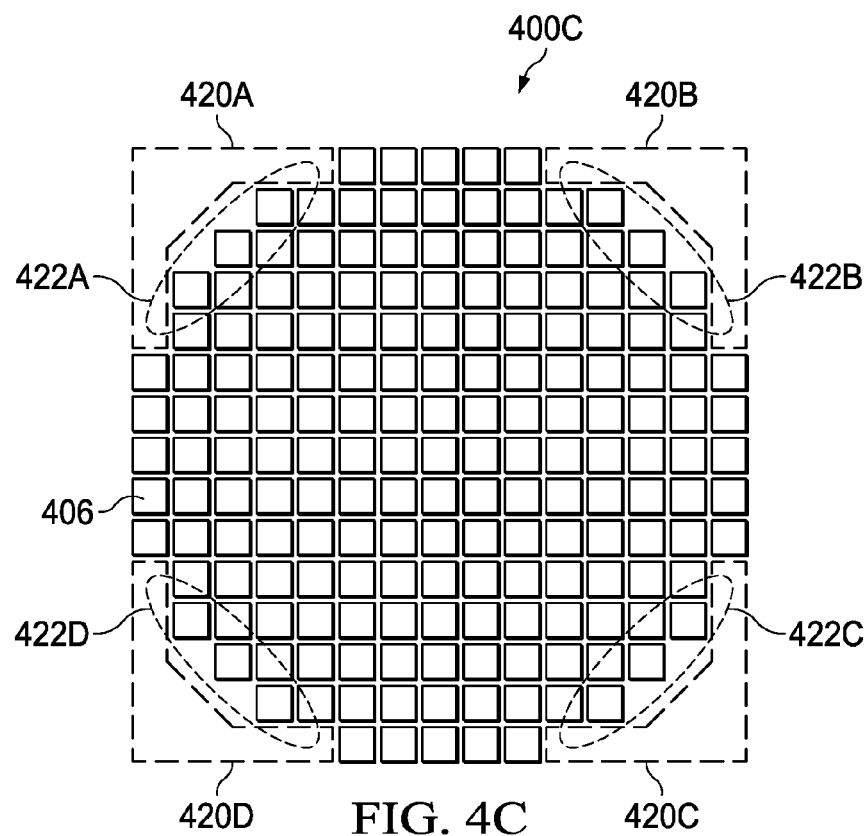
Figure 4D:
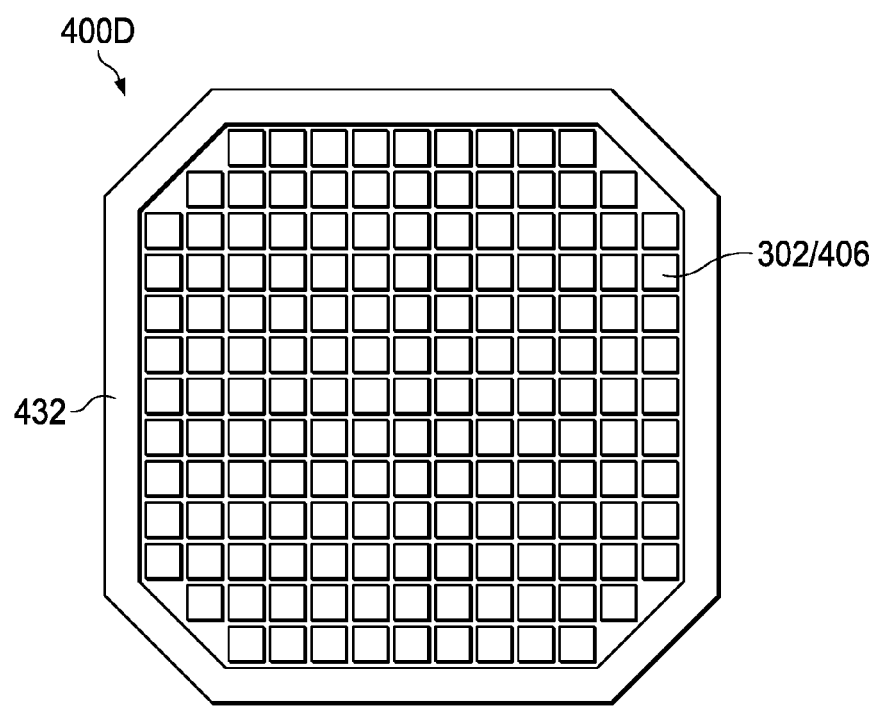
Figure 4E:
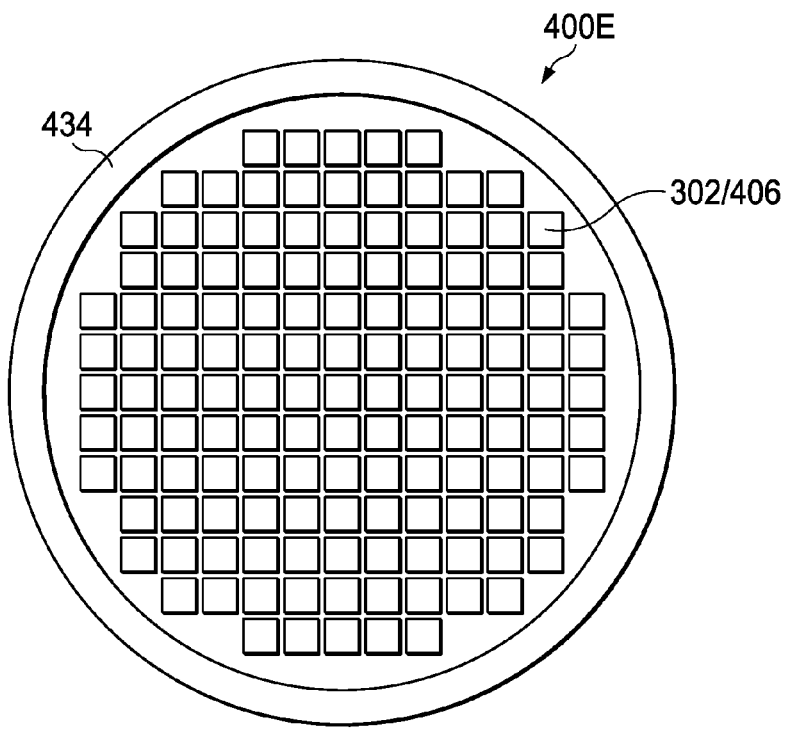
Figure 4F:
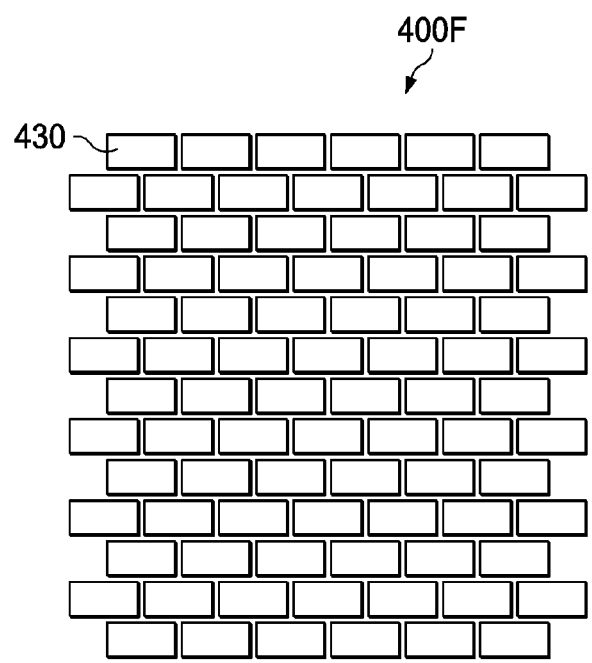
Figure 4G:
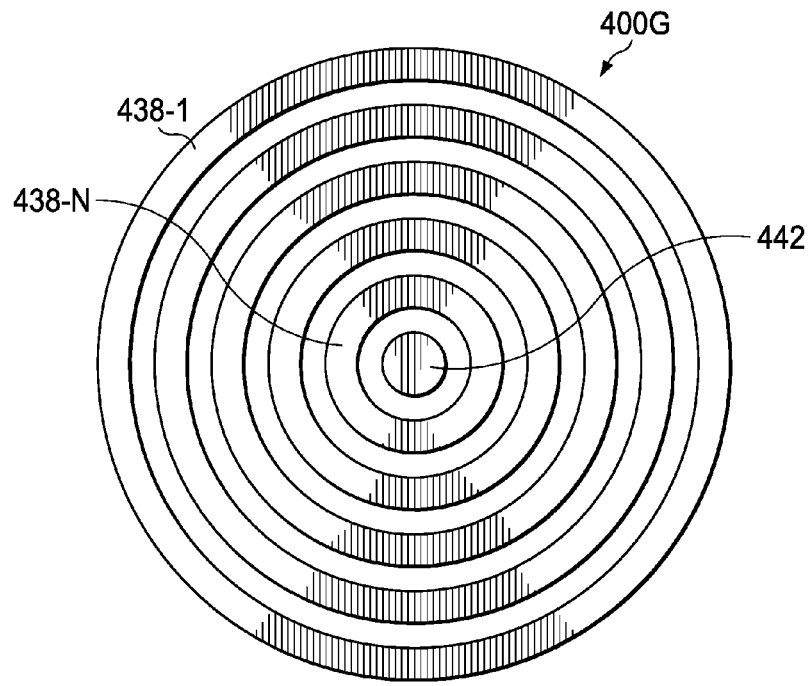
Figure 4H:
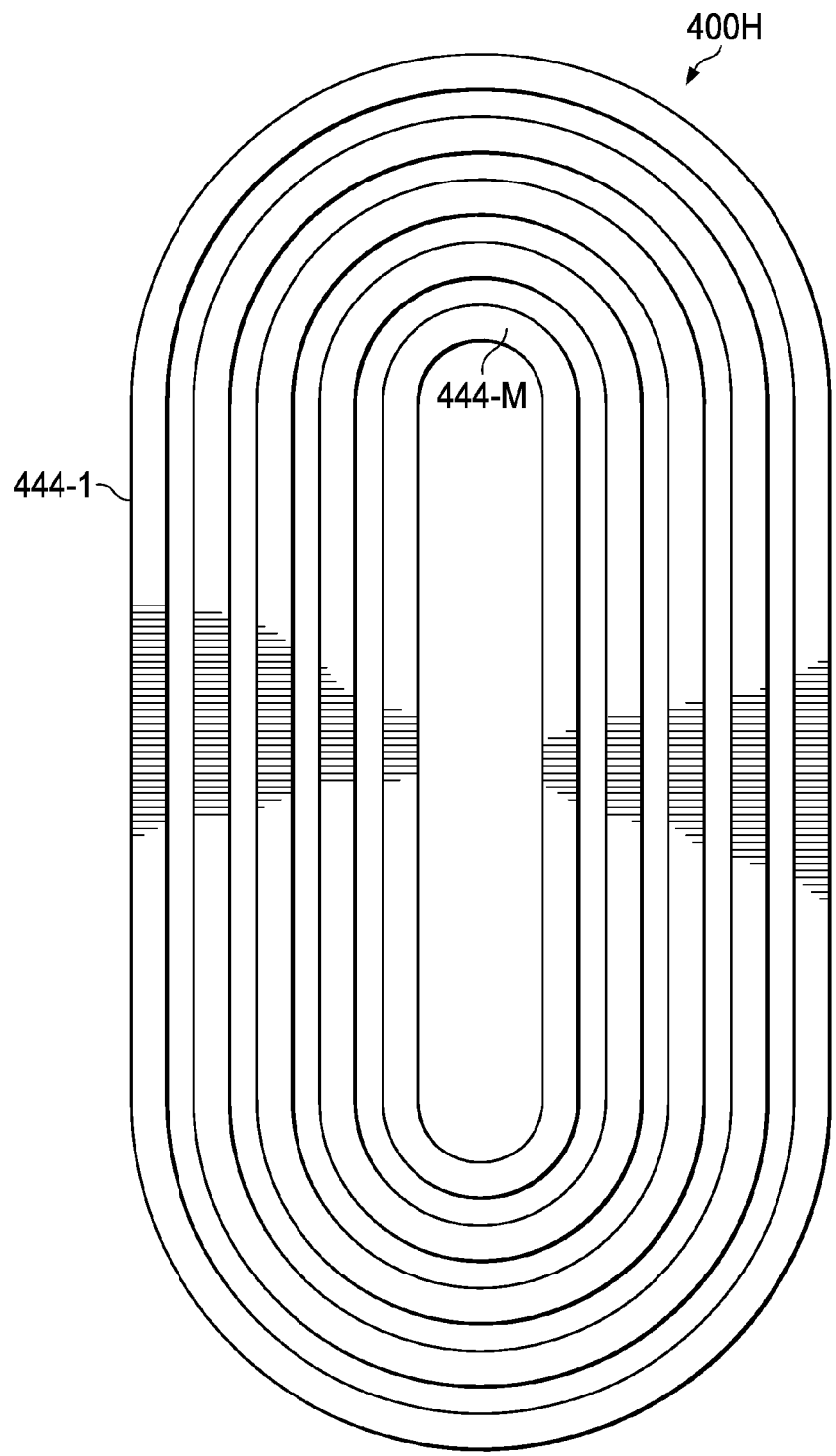

FIGS. 4A-2 to 4H depict still further example embodiments of an optimized contact aperture design that may be combined with one or more implementations set forth above for potentially improving ESD protection performance of a semiconductor TVS device. In the contact array embodiment 400A of FIG. 4A-2, each contact aperture 406 is shown as an enlarged square (e.g., similar to contact aperture feature 405 of FIG. 4A-1. FIG. 4B depicts a contact array arrangement 400B wherein a subset of contract apertures of a peripheral annulus region 414 (e.g., comprising 3 columns 410A and 3 rows 410B) may be enlarged by a factor of one quantity whereas the apertures of an interior region 412 may be enlarged by a factor another quantity. One skilled in the art will appreciate upon reference hereto that changing the array edge contact apertures can affect transient current distribution across all the contact apertures of the array 400B.

A further modification of a contact array arrangement 400C shown in FIG. 4C is illustrative of an embodiment where each of the corners of the array has been modified and the size of the contact apertures has been enlarged. In particular, a select number of contact apertures in a corner delta wing shape area 420A-420D are not formed, whereby a certain number of contact apertures remain in a basal region of the delta wing shape as exemplified by contact aperture groups 422A-422D. FIG. 4D depicts a similar contact array arrangement 400D with the respective corners of an array being devoid of contact apertures, but with the resultant contact array being enclosed in a continuous contact trench or aperture 432 formed around or along the periphery of the modified contact array, thereby surrounding the contact array. Whereas a polygonal continuous contact trench 432 is illustrated in the contact array arrangement 400D of FIG. 4D for enclosing a polygonal layout of the modified contact array, a circular continuous contact trench 434 is illustrated in FIG. 4E that encloses a modified contact aperture array shaped more like a circle. In further embodiments, contact apertures 302/406 of the arrangements 400D, 400E may comprise unmodified apertures and/or enlarged or reshaped apertures as discussed previously, wherein a modified array of contact apertures may be shaped as one of a hexagonal shape, octagonal shape, polygonal shape, regular/irregular shape, a circular or substantially circular shape, an elliptical or substantially elliptical shape, or an oval shape, and the like.

A contact array arrangement 400F shown in FIG. 4F is illustrative of individual contact apertures being reshaped as rectangular apertures 430 that are placed in a staggered tiling layout. As noted above, the orientation of such rectangular apertures (and staggering) may be rotated in a number of ways resulting in different orientations (e.g., horizontally or vertically aligned). In a further embodiment, such staggered arrays may be enclosed by a continuous contact trench of various shapes as well, wherein the continuous contact trench is positioned along a periphery of the array similar to the arrangement shown in FIGS. 4D and 4E.

In a still further embodiment, a contact structure may be formed as a relatively small number of contact apertures, each of which may be modified as a continuously extended feature (e.g., as a continuous trench contact) having a specific geometry, e.g., circle, ellipse, rectangle, square, polygon, etc. In FIG. 4G, for example, a contact arrangement 400G is shown as comprising a plurality of continuously extended contact "apertures" that are provided as concentric circular contacts 438-1 to 438-N, with the innermost contact aperture 442 remaining an aperture. In certain other variations, such an innermost contact aperture 442 may be removed altogether, thereby providing contacts arranged in a plurality of concentric circles. In a related variation 400H shown in FIG. 4H, a plurality of continuous contact trenches 444-1 to 444-M are extended in one orientation, resulting in a "race track" contact design having a plurality of concentric race tracks. Clearly, various other geometries may also be encompassed within the scope of the present invention.

Figure 5:
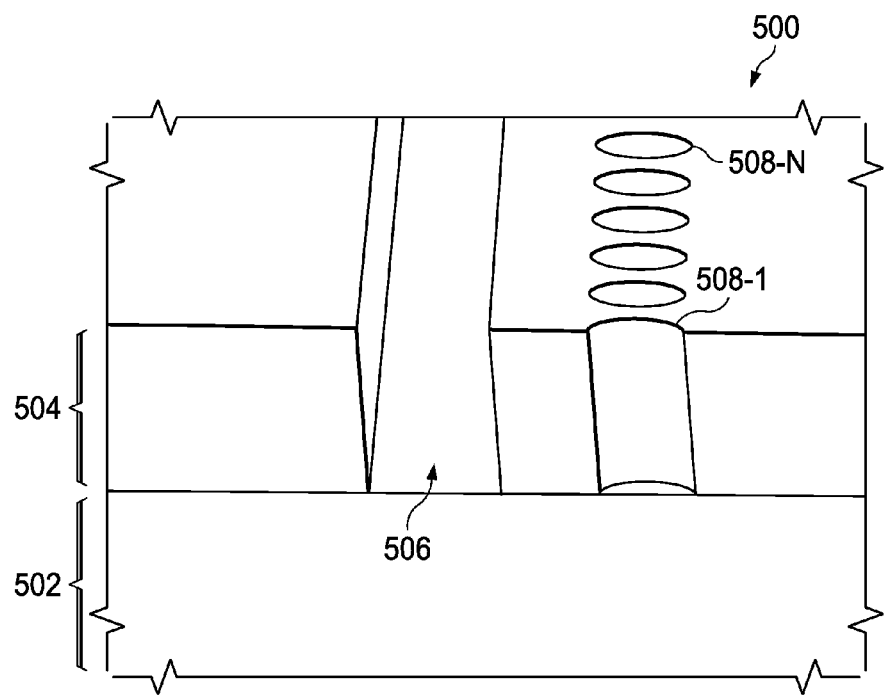
FIG. 5 is a rendition of a SEM view of a portion of a contact aperture array according to an example embodiment of the present invention.

FIG. 5 is a rendition of a scanning electron microscope (SEM) view 500 of a cross-sectional portion of a contact aperture array formed through a dielectric layer portion 504 that is disposed over an active area portion 502 according to an example embodiment of the present invention. A continuous contact trench 506 is illustrative of a trench 432 or 434 described above, which surrounds a column/row of contact apertures 508-1 to 508-N that may represent an outer edge of a contact aperture array.

In certain example implementations, a 3 kV improvement in ESD performance has been observed in both positive and negative voltage directions under applicable IEC rating tests (e.g., in terms of contact discharge and/or air gap discharge parameters under Level 4 ESD protection as per IEC 61000-4-2) for wafer splits having a modified contact array design of the present invention, e.g., by changing the contact aperture size from 0.43 µm by 0.43 µm to 0.62 µm by 0.62 µm. It should be appreciated that providing a larger contact aperture area in accordance with an embodiment of the present invention results in an increase in the overall contact area of a device, thereby lowering contact resistance (CRES) and RC delay, as well as improving transient current density parameters (e.g., relating to transient charge releasing capability). For example, a 3 kV ESD protection improvement seen by increasing the contact aperture size to 0.62 µm by 0.62 µm from 0.43 µm by 0.43 µm results in approximately a 20% increase of the transient current density (i.e., faster transient current discharge). Whereas an increased current flow through a conventional contact array can create strong electrical fields at the corners, edges, etc., which can cause damage (e.g., contact burnout), the enlarged apertures of the present invention can handle and account for the high electrical fields more robustly, thereby advantageously improving IEC ratings. In similar fashion, modifications in contact array shape and layout (e.g., cut corners, stretched contacts, trench contacts, circular contacts, etc.) also improve IEC ratings by ameliorating the "edge" effects of an electrical field.

Further, modifications such as stretched contacts as well as trenches to replace individual apertures provide higher space efficiency while staying compatible with state-of-the-art CMP technology used in contact/plug layer processing of various BEOL flows. By reducing the contact resistance, thus lowering RC delay, higher chip operation speeds can also be obtained without negatively impacting the yield. Additionally, one skilled in the art will recognize that contact array design embodiments disclosed herein can advantageously maximize the dynamic high current flow, especially IEC transient current flow, which enhances the performance of high speed and high power ESD devices.

Although various embodiments have been shown and described in detail, the claims are not limited to any particular embodiment or example. None of the above Detailed Description should be read as implying that any particular component, element, step, act, or function is essential such that it must be included in the scope of the claims. Reference to an element in the singular is not intended to mean "one and only one" unless explicitly so stated, but rather "one or more." All structural and functional equivalents to the elements of the above-described embodiments that are known to those of ordinary skill in the art are expressly incorporated herein by reference and are intended to be encompassed by the present claims. Accordingly, those skilled in the art will recognize that the exemplary embodiments described herein can be practiced with various modifications and alterations within the spirit and scope of the claims appended below.

What is claimed is:

1. A semiconductor fabrication method, comprising:
    forming an active area as part of an electrostatic discharge (ESD) protection circuit in a semiconductor substrate according to a select process technology;
    forming a dielectric layer over the active area;
    patterning the dielectric layer to define contact apertures overlapping the active area, the contact apertures each having a size based on an ESD protection parameter of the ESD protection circuit; and
    depositing a metallic composition to fill the contact apertures to provide an electrical conductive path between the active area and a metal layer deposited over the dielectric layer, wherein the contact apertures are defined as an array using a contact layer mask having an aperture size for a subset of contact apertures of a peripheral annulus region of the array larger than a size specified in the select process technology but complying with critical dimension (CD) rules and design rule checking (DRC) associated with the select process technology.

2. The semiconductor fabrication method as recited in claim 1, wherein the ESD protection parameter comprises an electrical parameter selected from the group consisting of a contact discharge parameter, an air gap discharge parameter, a transient current density parameter, and a combination thereof.

3. The semiconductor fabrication method as recited in claim 1, wherein the metallic composition filling the contact apertures comprises a tungsten-based composition.

4. The semiconductor fabrication method as recited in claim 1, wherein the contact apertures are defined as an array using a contact layer mask having an aperture size for each contact aperture of the array larger than a size specified in the select process technology but complying with critical dimension (CD) rules and design rule checking (DRC) associated with the select process technology.

5. The semiconductor fabrication method as recited in claim 1, wherein the active area comprises an n-well region or a p-well region formed in the semiconductor substrate.

6. An integrated circuit, comprising:
an active area formed as part of an electrostatic discharge (ESD) protection circuit in a semiconductor substrate according to a select process technology;
a dielectric layer over the active area;
a metal layer disposed on the dielectric layer; and
a contact structure formed between the active area and the metal layer, the contact structure having contact apertures patterned through the dielectric layer and filled with a metallic composition to provide an electrical conductive path between the active area and the metal layer, the contact apertures each having a size based on an ESD protection parameter of the ESD protection circuit,
wherein the contact apertures are defined as an array using a contact layer mask having an aperture size for a subset of contact apertures of a peripheral annulus region of the array larger than a size specified in the select process technology but complying with critical dimension (CD) rules and design rule checking (DRC) associated with the select process technology.

7. The integrated circuit as recited in claim 6, wherein the ESD protection parameter comprises an electrical parameter selected from the group consisting of a contact discharge parameter, an air gap discharge parameter, a transient current density parameter, and a combination thereof.

8. The integrated circuit as recited in claim 6, wherein the metallic composition filling the contact apertures comprises a tungsten-based composition.

9. The integrated circuit as recited in claim 6, wherein the contact apertures are defined as an array using a contact layer mask having an aperture size for each contact aperture of the array larger than a size specified in the select process technology but complying with critical dimension (CD) rules and design rule checking (DRC) associated with the select process technology.

10. The integrated circuit as recited in claim 6, wherein the active area comprises an n-well region or a p-well region formed in the semiconductor substrate.

11. A semiconductor fabrication method, comprising:
forming an active area as part of an electrostatic discharge (ESD) protection circuit in a semiconductor substrate according to a select process technology;
forming a dielectric layer over the active area;
patterning the dielectric layer to define contact apertures overlapping the active area, the contact apertures each having a size based on an ESD protection parameter of the ESD protection circuit; and
depositing a metallic composition to fill the contact apertures to provide an electrical conductive path between the active area and a metal layer deposited over the dielectric layer,
wherein the contact apertures are defined as an array using a contact layer mask, each contact aperture having a rectangular shape and arranged in a staggered array.

12. A semiconductor fabrication method, comprising:
forming an active area as part of an electrostatic discharge (ESD) protection circuit in a semiconductor substrate according to a select process technology;
forming a dielectric layer over the active area;
patterning the dielectric layer to define contact apertures overlapping the active area, the contact apertures each having a size based on an ESD protection parameter of the ESD protection circuit; and
depositing a metallic composition to fill the contact apertures to provide an electrical conductive path between the active area and a metal layer deposited over the dielectric layer,
wherein the contact apertures are defined as an array using a contact layer mask, the array having at least a corner devoid of any contact aperture, each contact aperture having an aperture size larger than a size specified in the select process technology but complying with critical dimension (CD) rules and design rule checking (DRC) associated with the select process technology, and
wherein the array of contact apertures is surrounded by a continuous trench contact aperture positioned along a periphery of the array.

13. The semiconductor fabrication method as recited in claim 12, wherein the array of contact apertures has a shape selected from a group consisting of a polygonal shape, a circular shape, and an elliptical shape.

14. A semiconductor fabrication method, comprising:
forming an active area as part of an electrostatic discharge (ESD) protection circuit in a semiconductor substrate according to a select process technology;
forming a dielectric layer over the active area;
patterning the dielectric layer to define contact apertures overlapping the active area, the contact apertures each having a size based on an ESD protection parameter of the ESD protection circuit; and
depositing a metallic composition to fill the contact apertures to provide an electrical conductive path between the active area and a metal layer deposited over the dielectric layer,
wherein the contact apertures are defined as continuous trench contact apertures arranged as a plurality of concentric circles.

15. A semiconductor fabrication method, comprising:
forming an active area as part of an electrostatic discharge (ESD) protection circuit in a semiconductor substrate according to a select process technology;
forming a dielectric layer over the active area;
patterning the dielectric layer to define contact apertures overlapping the active area, the contact apertures each having a size based on an ESD protection parameter of the ESD protection circuit; and depositing a metallic composition to fill the contact apertures to provide an electrical conductive path between the active area and a metal layer deposited over the dielectric layer, wherein the contact apertures are defined as continuous trench contact apertures arranged in a plurality of concentric race tracks.

16. An integrated circuit, comprising:

an active area formed as part of an electrostatic discharge (ESD) protection circuit in a semiconductor substrate according to a select process technology;

a dielectric layer over the active area;

a metal layer disposed on the dielectric layer; and a contact structure formed between the active area and the metal layer, the contact structure having contact apertures patterned through the dielectric layer and filled with a metallic composition to provide an electrical conductive path between the active area and the metal layer, the contact apertures each having a size based on an ESD protection parameter of the ESD protection circuit, wherein the contact apertures are defined as an array using a contact layer mask, each contact aperture having a rectangular shape and arranged in a staggered array.

17. An integrated circuit, comprising:

an active area formed as part of an electrostatic discharge (ESD) protection circuit in a semiconductor substrate according to a select process technology;

a dielectric layer over the active area;

a metal layer disposed on the dielectric layer; and a contact structure formed between the active area and the metal layer, the contact structure having contact apertures patterned through the dielectric layer and filled with a metallic composition to provide an electrical conductive path between the active area and the metal layer, the contact apertures each having a size based on an ESD protection parameter of the ESD protection circuit, wherein the contact apertures are defined as an array using a contact layer mask, the array having at least a corner devoid of any contact aperture, each contact aperture having an aperture size larger than a size specified in the select process technology but complying with critical dimension (CD) rules and design rule checking (DRC) associated with the select process technology, wherein the array of contact apertures is surrounded by a continuous trench contact aperture positioned along a periphery of the array.

18. The integrated circuit as recited in claim 17 wherein the array of contact apertures has a shape selected from a group consisting of a polygonal shape, a circular shape, and an elliptical shape.

19. An integrated circuit, comprising:

an active area formed as part of an electrostatic discharge (ESD) protection circuit in a semiconductor substrate according to a select process technology;

a dielectric layer over the active area;

a metal layer disposed on the dielectric layer; and a contact structure formed between the active area and the metal layer, the contact structure having contact apertures patterned through the dielectric layer and filled with a metallic composition to provide an electrical conductive path between the active area and the metal layer, the contact apertures each having a size based on an ESD protection parameter of the ESD protection circuit, wherein the contact apertures are defined as continuous trench contact apertures arranged in a plurality of concentric circles.

20. An integrated circuit, comprising:

an active area formed as part of an electrostatic discharge (ESD) protection circuit in a semiconductor substrate according to a select process technology;

a dielectric layer over the active area;

a metal layer disposed on the dielectric layer; and a contact structure formed between the active area and the metal layer, the contact structure having contact apertures patterned through the dielectric layer and filled with a metallic composition to provide an electrical conductive path between the active area and the metal layer, the contact apertures each having a size based on an ESD protection parameter of the ESD protection circuit, wherein the contact apertures are defined as continuous trench contact apertures arranged in a plurality of concentric race tracks.

* * * * *